(12) United States Patent
Mittendorfer et al.

(10) Patent No.: US 12,283,491 B2
(45) Date of Patent: Apr. 22, 2025

(54) METHOD FOR PRODUCING SINGULATED ENCAPSULATED COMPONENTS

(71) Applicant: EV Group E. Thallner GmbH, St. Florian am Inn (AT)

(72) Inventors: Gerald Mittendorfer, Stuben (AT); Friedrich Paul Lindner, Schärding (AT)

(73) Assignee: EV GROUP E. THALLNER GMBH, St. Florian am Inn (AT)

( * ) Notice: Subject to any disclaimer, the term of this patent is extended or adjusted under 35 U.S.C. 154(b) by 424 days.

(21) Appl. No.: 17/781,977

(22) PCT Filed: Dec. 19, 2019

(86) PCT No.: PCT/EP2019/086421
§ 371 (c)(1),
(2) Date: Jun. 2, 2022

(87) PCT Pub. No.: WO2021/121608
PCT Pub. Date: Jun. 24, 2021

(65) Prior Publication Data
US 2023/0015545 A1 Jan. 19, 2023

(51) Int. Cl.
*H01L 21/52* (2006.01)
*H01L 21/78* (2006.01)

(52) U.S. Cl.
CPC ............. *H01L 21/52* (2013.01); *H01L 21/78* (2013.01)

(58) Field of Classification Search
CPC ................................ H01L 21/52; H01L 21/78
See application file for complete search history.

(56) References Cited

U.S. PATENT DOCUMENTS

| | | | |
|---|---|---|---|
| 6,214,692 | B1 | 4/2001 | Thallner |
| 6,995,462 | B2 | 2/2006 | Bolken et al. |
| 7,541,658 | B2 | 6/2009 | Kinsman |
| 7,745,897 | B2 | 6/2010 | Tan et al. |
| 2004/0038442 | A1 | 2/2004 | Kinsman |
| 2005/0059188 | A1 | 3/2005 | Bolken et al. |
| 2007/0021524 | A1 | 1/2007 | Watanabe et al. |

(Continued)

FOREIGN PATENT DOCUMENTS

| | | |
|---|---|---|
| EP | 1474356 B1 | 11/2004 |
| EP | 1564804 B1 | 8/2005 |

(Continued)

OTHER PUBLICATIONS

Office Action mailed Dec. 20, 2023 from related/corresponding Japanese Patent Appl. No. 2022-532111.

(Continued)

*Primary Examiner* — Nathan W Ha
(74) *Attorney, Agent, or Firm* — RENNER, OTTO, BOISSELLE & SKLAR, LLP

(57) ABSTRACT

A method for producing singulated encapsulated components. The method includes the steps of application of a frame structure on a substrate surface of a substrate, wherein the frame structure surrounds components arranged on the substrate surface; bonding of a cover substrate on the frame structure; hardening of the frame structure; and singulation of the encapsulated components, wherein the frame structure is formed from an adhesive.

7 Claims, 5 Drawing Sheets

(56) References Cited

U.S. PATENT DOCUMENTS

| | | | |
|---|---|---|---|
| 2007/0111471 A1* | 5/2007 | Okada | B81C 3/001 438/455 |
| 2009/0088527 A1* | 4/2009 | Seo | C08L 21/00 525/403 |
| 2010/0243999 A1 | 9/2010 | Ishikawa | |
| 2012/0104571 A1* | 5/2012 | Yoo | H01L 24/97 257/659 |
| 2015/0266772 A1 | 9/2015 | Mitsui et al. | |
| 2016/0133579 A1* | 5/2016 | Akiba | H01L 24/94 257/659 |
| 2017/0256500 A1* | 9/2017 | Park | B65D 47/244 |
| 2017/0287880 A1* | 10/2017 | Fuergut | H01L 23/3135 |
| 2019/0383761 A1* | 12/2019 | Kimura | H01L 24/48 |
| 2020/0381390 A1* | 12/2020 | Zhang | H01L 23/49541 |
| 2021/0013052 A1* | 1/2021 | Stieglauer | H01L 21/52 |

FOREIGN PATENT DOCUMENTS

| | | |
|---|---|---|
| JP | 2002-050939 A | 2/2002 |
| JP | 2014-216557 A | 11/2014 |
| JP | 2019-081342 A | 5/2019 |
| TW | 200703531 A | 1/2007 |
| TW | 201505137 A | 2/2015 |
| WO | WO2014/202106 A1 | 12/2014 |
| WO | WO2016/113008 A1 | 7/2016 |
| WO | WO2017/203795 A1 | 11/2017 |

OTHER PUBLICATIONS

International Search Report from corresponding International Patent Application No. PCT/EP19/86421, dated Apr. 30, 2020 _.
Tang et al., "Chapter 2: Basic Microfluidic and Soft Lithographic Techniques," Optofluidics: Fundamentals, Devices, and Applications. Ukraine, McGraw-Hill Education, 2009, pp. 7-32.
Mittal, K. L., editor. "2.3 Methods for Cross-Linked PDMS Surface Modification."*Progress in Adhesion and Adhesives*, vol. 1, John Wiley & Sons, Inc., Hoboken, NJ, 2015, pp. 37-48. <https://books.google.at/books?id=8kdECgAAQBAJ&pg=PA38&lpg=PA38&dq=pdms+SiOx+glassy+barrier&source=bl&ots=pXRpYs2zWn&sig=VeEmSyLIR1WY-mBm17God15Czy4&hl=de&sa=X&ved=0ahUKEwjZwL_PivLUAhUGWRQKHdm9BAcQ6AEIVjAG#v=onepage&q=pdms%20SiOx%20glassy%20barrier&f=false>.
Office Action (with English translation) dated Apr. 23, 2024 from related/corresponding Taiwanese Patent Appl. No. 109137805.

* cited by examiner

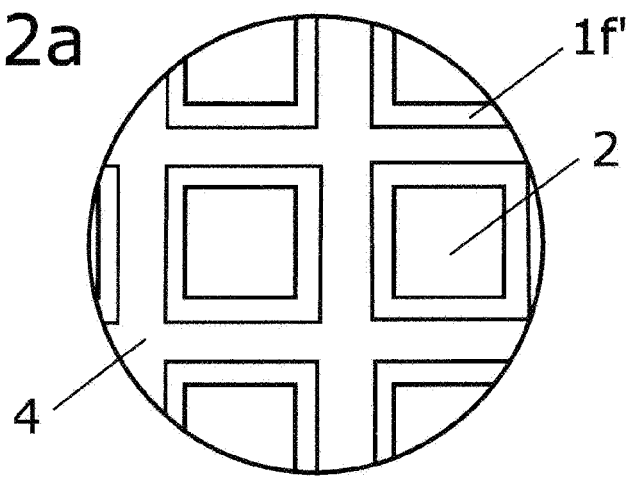
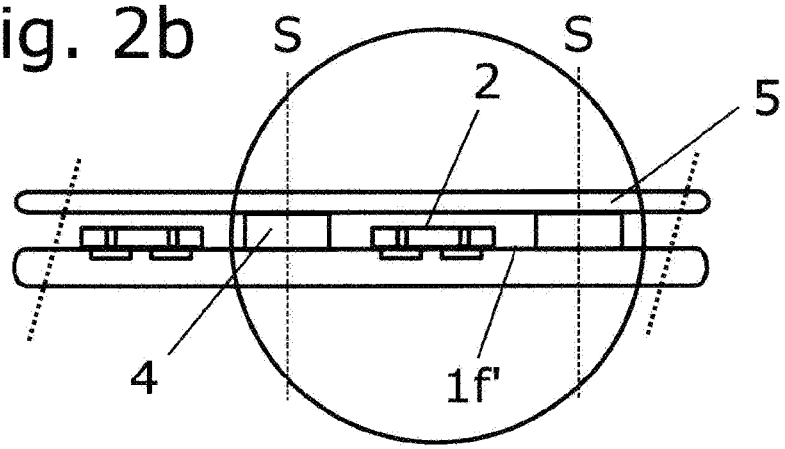
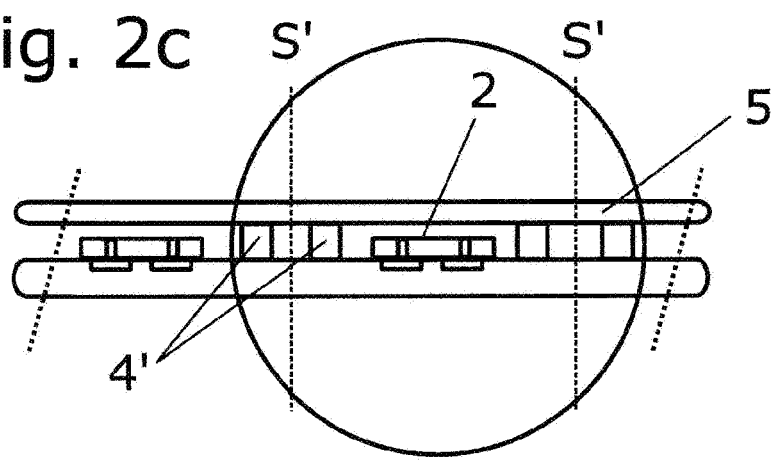

METHOD FOR PRODUCING SINGULATED ENCAPSULATED COMPONENTS

FIELD OF INVENTION

The invention relates to a method, a system, and components for producing singulated encapsulated components.

BACKGROUND OF INVENTION

The production of components in the semiconductor industry is split up into the areas of wafer production (frontend) and assembly (backend). Depending on the area of the components, a substrate or a wafer contains up to several hundred components after the wafer production. The components are singulated by sawing (dicing) and wired and encapsulated or cast in a housing in the assembly. A multiplicity of components can also be mounted on a common carrier and the encapsulation (packaging) then takes place.

Casting resins or casting compounds such as for example epoxy resins, which are used for casting-in components, are not the preferred embodiment of a hermetic encapsulation. These casting compounds are particularly well suited for semiconductor components that do not require a housing cavity. As soon as optical or mechanical properties of the components are impaired, casting compounds can no longer be used.

The encapsulation in a housing serves both for mechanical protection and also for shielding against environmental influences such as air humidity, oxygen or dust particles. Hermetic packaging makes it possible to build up an air-tight atmosphere in the housing and thus to store the components, depending on requirements, in a vacuum or under a protective gas atmosphere. For example, the component-carrier is often glued or soldered to the housing cover under protective gas. In order to enable a vacuum for longer in the encapsulations, a getter can also be used. The getter is a chemically reactive material, which can bind molecules by a chemical reaction or by sorption.

The components or units are functional units especially of an optical and/or electronic kind, e.g. amongst others sensors, chips, LEDs (light-emitting diodes) or optoelectronic components, MEMS (microelectromechanical systems), lenses and lens stacks, resonators etc. Sensors which are encapsulated include for example optical sensors, acceleration sensors and rotation sensors. A component or a unit can contain an integrated circuit, which emerges in the processing of the semiconductor substrate.

MEMS are often packaged hermetically sealed individually in packages in the prior art. Single chip processing, however, is time-consuming.

In recent years, new packaging concepts have therefore been developed which, especially after the wafer structuring, carry out the encapsulation process completely on the wafer level. Wafer level packaging (WLP) avoids the handling of individual components by encapsulation on the wafer level. WLP thus differs from conventional encapsulation in that all the processes take place directly on the substrate or wafer and, only after the encapsulation, the WLP packages are singulated from the wafer by dicing and other methods such as laser irradiation. The shape factor, which defines the size of a component, and which is calculated from the ratio of the encapsulation size to the component size, is therefore almost equal to 1.

If a plurality of components, in particular chips, are also integrated vertically into two or more layers, one speaks of a 3D-integrated circuit (3D-IC). The encapsulation of 3D-ICs, 3D packaging, saves space by stacking of a plurality of chips in a single housing. In a wafer-to-wafer (W2 W) process, the wafer and the components located thereon is bonded to the cover substrate and then diced. Alternatively, a chip-to-wafer (C2 W) process would be possible, where for example already singulated covers are applied individually on the segregated components. The wafer is then diced with the finished encapsulated components. C2 W processes enable the use of chips of different sizes.

Due to the requirements of miniaturisation, conventional housings made of ceramic or metal, which comprise for example a tank and a cover and are closed, welded or soldered together, no longer come into question.

In the prior art, there are many approaches for almost hermetic or hermetic encapsulations on the wafer level, for example methods which include amongst other things welding or soldering with metals, bonding methods such as for example glass-frit bonding, fusion bonding, anodic bonding or adhesive bonding with plastics, or the use of polymer materials such as benzocyclobutene (BCBs) or liquid-crystal polymers (LCPs).

In the case of anodic bonding, three-dimensional structured glass wafers are used for the encapsulation of components on a substrate or product wafer. Similarly, in the case of other bonding methods structured silicon wafers are required. The covering with a 3-D structured cover substrate, however, is time-consuming and cost-intensive, since the 3-D structures first have to be produced. High process temperatures, which limit the use of methods such as fusion bonding, are a further problem.

BCBs are used in the prior art as intermediate layers for an almost hermetic seal. The latter polymerise under the effect of heat and are used in the semiconductor industry as dielectrics, intermediate layers or sealing layers. LCPs have good barrier properties against gases and water vapour, which is made use of in the application as films for the encapsulation of components. The LCP film covers for example a product substrate and contains cavities for the individual components. PCBs and LCPs, however, only enable an almost hermetic encapsulation.

If adhesives are used, the encapsulation takes place with the aid of cover substrates, which are bonded using an adhesive to the substrate or product substrate provided with components. If the adhesives are polymers, the barrier properties of the polymers should also be suitable for a hermetic seal.

The production of hermetic encapsulations in the sense of diffusion tightness of the produced encapsulations is still a great challenge, especially when a housing cavity is present. Hermetic packaging makes it possible to build up an airtight atmosphere in the housing and thus to store the components, depending on requirements, in a vacuum or under a protective gas atmosphere. If the hermeticity is not provided or only inadequately so, the resistance or useful life of the components is shortened. Moisture penetrating over time often causes problems such as malfunctions due to the formation of condensation or the formation of corrosion. Organic light emitting diodes are very sensitive for example not only to moisture but also to oxygen.

The problem with the adhesives in the prior art as it stands today is that non-hermetic or only almost hermetic encapsulation are often obtained. A hermetic encapsulation for example is not possible with epoxy adhesive.

Furthermore, not only an adhesive is required, but a frame structure surrounding the individual components must first be applied or built up. This can be on the product substrate and/or on the cover substrate and/or it can also be a structured substrate cover, i.e. cover substrate.

EP1474356B1 uses a frame structure made of photopatternable epoxy resin such as for example SU-8. The connection of the cover substrate to the frame structure takes place either with the aid of an additional adhesive layer or by bonding the cover substrate to the frame structure.

In U.S. Pat. No. 6,995,462B2, a transparent cover substrate is bonded onto a product wafer with optical sensors. The adhesive is applied structured directly on the product wafer or on the cover substrate. The adhesive used is for example an epoxy, silicone or acrylic adhesive. The encapsulated components are then singulated.

U.S. Pat. No. 7,541,658B2 also shows a repeated application of cross-linkable material around the individual chip sensors of a carrier substrate in order to build up a frame structure. The chips are then encapsulated with a cover substrate.

A drawback in the prior art is that the frame structure has to be fixed to the carrier substrate with an adhesive layer and to the cover substrate with a further adhesive layer. This method comprises a very large number of steps and is very time-consuming.

A problem with the prior art includes that, after the singulation of the encapsulated components, often only an insufficiently hermetic sealing of the package can be achieved with conventional adhesives or further materials that are used for the frame structure. This means problems with the long-term reliability and a shortened useful life of the encapsulated components.

SUMMARY OF INVENTION

The problem solved by the present invention includes removing the drawbacks of the prior art and in particular in specifying an improved and simplified method for the hermetic encapsulation of a component.

This problem is solved with the features of the independent claim(s). Advantageous developments of the invention are stated in the dependent claim(s). The scope of the invention also includes all combinations of at least two of the features stated in the description, the claims and/or the figures. In the case of stated value ranges, values lying within the stated limits are also deemed to be disclosed as limiting values and can be claimed in any combination.

The invention relates to a method for producing singulated encapsulated components, with the following steps:
application of a frame structure on a substrate surface of a substrate, wherein the frame structure surrounds components arranged on the substrate surface,
bonding of a cover substrate on the frame structure,
hardening of the frame structure,
singulation of the encapsulated components,
wherein the frame structure is formed according to the invention from an adhesive.

The invention further relates to a system for producing singulated encapsulated components, wherein a method according to the invention can be carried out, comprising:
a process chamber for receiving the singulated and encapsulated components,
a receiving device for receiving the singulated and encapsulated components,
a treatment means for treating the frame structure of the components.

The invention further relates to a singulated encapsulated component, produced with a method according to the invention and/or a system according to the invention.

Quicker and simpler production of the frame structure is advantageously possible and at the same time an additional adhesive layer is not required, so that fewer work steps are required.

In particular, the idea underlying the invention is that, after the singulation of the components, a post-treatment of the frame structure takes place in order to achieve a completely hermetic encapsulation in the sense of diffusion tightness.

The adhesive is preferably a silicone adhesive. Improved tightness can thus be advantageously achieved.

The singulated encapsulated components are preferably treated in such a way that a glass-like structure arises, in particular an SiO2 structure. Improved sealing can thus advantageously be achieved.

The singulated encapsulated components are preferably treated with plasma and/or gas. Improved tightness can thus advantageously be achieved.

The invention relates in particular to encapsulated components with a stacked structure bonded with adhesive, the outer edges whereof are almost identical, comprising:
components,
a frame structure, which surrounds the components and forms a closed cavity inside a stacked structure, and
a diffusion-tight cover,
wherein the frame structure acts as a spacer between the components and the cover,
wherein the hermeticity after the singulation of the encapsulated components is achieved by treatment of the frame structure or by treatment of the already hardened adhesive by plasma, preferably $O_2$-plasma and/or UV/ozone and/or laser and/or reactive gases.

The components according to the invention particularly advantageously achieve an improved hermetic encapsulation compared to the prior art, since the post-treatment of the outer walls made of the frame material leads to a densification of the surface and therefore to a hermetic encapsulation with increased long-term reliability.

In particular, the invention describes a method for producing hermetically encapsulated components with the following steps:
application of a frame structure, which in each case surrounds individual components of a product substrate, preferably ready-bonded components depending on the type of unit,
bonding of the product substrate and the cover substrate by gluing of the frame structure to the diffusion-tight cover substrate,
hardening of the adhesive of the frame structure,
singulation of the encapsulated components,
treatment of the already singulated and encapsulated components with plasma, preferably $O_2$-plasma and/or UV/ozone and/or laser and/or reactive gases, wherein a surface conversion to form dense $SiO_2$ is achieved by the treatment of the adhesive-frame structure.

In a particular embodiment, the hardening of the frame structure can also take place before the bonding of the product substrate and the cover substrate or the hardening of the frame structure preferably takes place before the bonding of the cover substrate on the frame structure. In this embodiment, a layer of adhesive is applied congruent on the already hardened frame structure before the bonding of the product substrate and cover substrate and is hardened after the bonding. The selection of the embodiment is also guided, amongst other things, by the required height of the frame structure. In order to achieve the required height of the frame structure, a repeated application of material for the frame structure is also conceivable, wherein each layer, depending on the material selection, is either not hardened, partially hardened or completely hardened before the next layer is applied.

A core aspect of the invention includes that, as a result of the subsequent chemical and/or physical treatment of the frame structure of the already singulated and encapsulated components, a simplified method for encapsulation on the wafer level with adhesive can be used, which enabled encapsulation of high quality and hermeticity.

The frame structure thus serves not only as a mechanical stabiliser, but also as protection against particles and media occurring in the atmosphere and/or in the surroundings, in particular fluids, more specifically fluids or gases, in particular water (moisture) and the oxygen.

The adhesive of the frame structure can be applied for example by processes such as inkjet processes, printing processes, casting, coating, spraying, extruding and/or lacquering. A further technique for the application of the adhesive is for example spray coating or spray lacquering. This is a technique in which a nozzle atomises a liquid to be applied, while it is carrying out a relative movement with respect to a substrate. The relative movement between the nozzle and the substrate can be a simple rotation, a translation or complicated movements.

Some adhesive materials have a high viscosity and, if need be, have to be diluted with a solvent. The application of a frame structure according to the invention on the product substrate can take place for example with a system according to WO 2016/113008A1, to which reference is made in this regard.

Alternatively, inkjet processes and printing processes, for example microcontact printing processes, screen printing or flexoprinting, can be used from the application of the adhesive structure or the frame structure.

The method according to the invention is based on a two-part encapsulation, i.e. with a frame structure surrounding the components on the product substrate and a cover substrate placed thereon. Before the bonding for the encapsulation, the product substrate and the cover substrate must be aligned with one another as precisely as possible. The alignment of the substrates is preferably carried out with corresponding alignment devices. Such alignment devices are described for example in WO 2014/202106A1, to which reference is made in this regard. The alignment preferably takes place by means of alignment marks. The functional units, i.e. the components, are located beside the alignment marks on the product substrate.

The substrates preferably have approximately identical diameters, which in particular diverge from one another by less than 5 mm, preferably less than 3 mm, still more preferably less than 1 mm.

Systems for bonding substrates are described for example in patent specifications EP1564804B1 and U.S. Pat. No. 6,214,692B1. The alignment and bonding takes place in particular according to the stated patent specifications and is not described in greater detail.

The singulation can be carried out by various methods. For example, mechanical dicing as well as plasma-based and/or laser-based separating methods are used as separating methods in the singulation.

A further subject-matter of the present invention relates in particular to a system for producing and/or treating the singulated and encapsulated components, in particular carrying out a method according to the invention, comprising A process chamber for receiving the singulated and encapsulated components, A receiving device for receiving the singulated and encapsulated components, A plasma source and/or a UV-light and/or an ozone source and/or a laser source for treating the frame structure of the singulated and encapsulated components, Means for introducing one or more gaseous components into the process chamber, heating means and control means for the temperature control of the receiving device and the process chamber.

The device/system can be designed in a modular manner and in particular be part of an entire system. The device can however also itself be an entire system with a plurality of modules.

By means of the device according to the invention and the method according to the invention, it is possible in particular to load a multiplicity of singulated and encapsulated components simultaneously in the device, in order then to treat the outer walls of the frame structures simultaneously, so that a surface conversion to form dense $SiO_x$, in particular $SiO_2$, is promptly achieved and therefore the long-term hermeticity of the encapsulations is guaranteed.

Adhesive Material or Material of the Frame Structure

Adhesives, in particular UV adhesives, are used for bonding the product substrate to the cover substrate in the method according to the invention. The frame structures around the individual components on the product substrate are also produced with the adhesive. After the singulation, the frame structures define the outer walls of the encapsulated components.

The singulation of the encapsulated components can be carried out for example either in the middle through the frame structures or between two framed structures, depending on how the latter have been applied around the components of a product substrate.

The hardening of the adhesive can be carried out by electromagnetic radiation, by heat, by current, by magnetic fields and/or other methods.

Depending on the material, the hardening of the adhesive takes place by electromagnetic radiation, preferably by UV-light or IR-light. The electromagnetic radiation has a wavelength in the range between 10 nm and 2000 nm, preferably between 10 nm and 1500 nm, more preferably between 10 nm and 1000 nm, most preferably between 10 nm and 500 nm.

Thermal hardening methods are also conceivable. Thermal hardening takes place between 0° C. and 500° C., preferably between 0° C. and 400° C., still more preferably between 0° C. and 300° C., most preferably between 0° C. and 200° C.

The hardening is based in particular on a polymerisation of the adhesive. The polymerisation is started by a so-called initiator. If electromagnetic radiation is used for the hardening, at least one of the two substrates, in particular the cover substrate, is transparent or sufficiently transparent for electromagnetic radiation of the wavelength range in which cross-linking of the adhesive occurs. In particular, the cover substrate is a glass or a sapphire substrate.

For the adhesion, the application of the adhesive can take place over the whole area or selectively along the frame structure on the product substrate and/or on the cover (cover substrate) and/or on an intermediate layer. If the frame structure is applied with the adhesive, the application of the adhesive takes place selectively or in structured manner to produce a frame structure preferably on the product substrate.

Permanent adhesives are preferably used. Permanent adhesives are polymers, the polymer chains whereof permanently cross-link with one another under a chemical, thermal or electromagnetic effect. The cross-linking process is irreversible. Such polymers are used to bond substrates together, in particular substrates made of different materials.

According to the invention, the adhesives include, amongst others, epoxy resins, photoresist materials, fluoropolymers, silsesquioxanes, benzocylcobutenes, polymethyl methacrylates, polydimethylsiloxanes (PDMS), polyarylene ether, polyetheretherketones, liquid crystal polymers and thermoplastic copolymers such as for example polyvinylidene chloride.

For wafer-to-wafer (W2W) processes, epoxy materials such as SU-8 and benzocyclobutene (BCB) have become established as adhesives at a bonding temperature below 250° C.

Adhesives on a silicone base are preferably used, such as for example polydimethylsiloxane (PDMS) adhesives or adhesives containing octafunctional polyhedral silsesquioxane (POSS), which after hardening comprise on their surfaces or in layers close to the surfaces Si—O and/or Si—OH units, which can be converted by chemical and/or physical treatment to form dense $SiO_2$. In particular, a surface conversion should take place, as a result of which hermetisation of the frame structure made of the adhesive on a silicone base is achieved.

In a particular embodiment, the frame structure material or the adhesive can also be a polymer composite, in order to exhibit special properties. The adhesive can for example have both organic and inorganic fractions, or contain particles, such as for example metal particles, in particular nanoparticles, or also be electrically conductive. If only a part of the electromagnetic radiation is let through by the hardened adhesive, the frame structure or adhesive acts as a filter.

During bonding, the product substrate and the cover substrate are bonded. The bonding takes place by gluing of the frame structure to a diffusion-tight cover substrate, pressure and/or temperature also being able to be used during bonding.

Surface Conversion of the Frame Structure on the Singulated and Encapsulated Component.

One of the last process steps in wafer level packaging is the singulation, wherein the ready processed substrates of the finished and encapsulated components are separated. The singulation of the components (dicing) can take place by dicing, laser processing (laser dicing) or plasma processing (plasma dicing).

Only after the singulation of the encapsulated components can the frame structure be post-treated in accordance with the invention, so that the desired hermeticity of the encapsulation is achieved. The treatment of the frame structure of the encapsulated components after the singulation has the advantage that it can be carried out simultaneously on a plurality of singulated and encapsulated components.

After the singulation, the encapsulated components do not necessarily have to be exposed. Before the singulation, a dicing tape (dicing tape), for example, can be glued on the substrate. Dicing tapes are for example adhesive tapes, thermal tapes or UV tapes. The substrate is fixed with a dicing frame. Dicing rings are able to fix the tape additionally in the expanded state and are pressed in between the substrate and the dicing frame.

In a first exemplary embodiment, it is necessary for the further treatment of the encapsulated components to increase the spacing of the separated encapsulated components by expanding the dicing tape. Expansion frames, for example, are used for this purpose. This permits improved access to the side walls, i.e. to the frame structure of the encapsulated components, and thus enables a more efficient post-treatment.

If the singulated and encapsulated components are still fixed on a tape, in particular on a dicing tape clamped in a dicing frame, all the singulated components of a substrate or wafer can be treated simultaneously on the wafer level, without more time-consuming individual chip handling being required. Devices already existing for the handling of wafers can advantageously be used, as a result of which the post-treatment processes are simplified.

The compatibility of the tape and frame materials with the (post) treatment methods, such as for example, in particular, plasma processes, is preferably checked occasionally and the correspondingly suitable materials are selected.

In process conditions in which tapes are no longer a suitable, e.g. at high temperatures and/or chemical and/or physical etching rates, the encapsulated components are processed in individual chip handling processes in a second exemplary embodiment. Thus, even in this embodiment, a plurality of singulated and encapsulated components can be treated simultaneously.

In a third exemplary embodiment, the singulated and encapsulated components can also be transported and handled loose in a receiving device suitable for the purpose.

According to the invention, adhesives on a silicone base are especially preferred for the production of the frame structure, such as for example PDMS adhesives or POSS-containing adhesives, which after hardening comprise on their surface or in layers close to the surface Si—O and/or Si—OH units, which can be converted to form an $SiO_x$ or an $SiO_2$ surface layer by chemical and/or physical processes during the post-treatment.

Plasma processes and ion sputtering processes are used in the semiconductor industry for cleaning and/or activation of surfaces. The methods for surface cleaning and/or surface activation belonging to the prior art are generally used for the preliminary treatment of the substrate surface for a following process. It is known from scientific publications (for example "Progress in Adhesion and Adhesives", Ed. K. L. Mittal, Scrivener Publishing and John Wiley & Sons, 2015) that the surface of polydimethylsiloxane (PDMS) can be activated by plasma treatment, so that permanent bonding with a second PDMS surface or a glass surface is possible. The surface is oxidised by the $O_2$ plasma treatment and silanol groups arise at the PDMS surface. If contact is made between two plasma-treated surfaces, covalent —O—Si—O— compounds arise.

According to the invention, the plasmas produced by means of oxygen, nitrogen, noble gases on more complex organic gaseous compounds can preferably modify the substrate surface both by ion bombardment as well as by surface reactions by means of ions and radicals present in the plasma.

In a preferred embodiment, oxygen-plasma ($O_2$-plasma) is used. According to the invention, the process parameters of the $O_2$-plasma treatment are optimised in such a way that a surface conversion of the exposed frame structure, which is made of adhesive on a silicone base, to form dense $SiO_2$ takes place. For this purpose, process parameters such as gas mixture, temperature and duration of the $O_2$-plasma treatment are optimised in such a way that a successful and durable surface conversion to form dense $SiO_2$ takes place. Hermetic sealing of the already hardened outer frame structure of the encapsulated components is thus achieved.

In a further embodiment according to the invention, an additional component is introduced in the $O_2$-plasma process in order that, by reaction with the surface of the frame structure, a more rapid surface conversion of the exposed frame structure to form dense $SiO_2$ or $SiO_x$ is achieved.

According to the invention, the additional component can preferably be a mixture of a plurality of substances or an individual chemical compound. The additional component is preferably introduced as a gas. In an independent embodiment according to the invention, siloxanes are used as a chemical compound. These include for example disiloxane, hexamethyldisiloxane (HMDS) and octamethyltrisiloxane. HMDS is suitable for depositing stable, scratch-resistant layers and protective layers in plasma. Plasmas with HMDS-oxygen gas mixtures are used. Highly reactive fragments of the siloxane monomers (amongst others, radicals and ions) arise in the plasma, which form a polymer layer at the surface (plasma polymerisation). With increasing oxygen concentration, the layer deposition arises through recombination of the Si—O—Si radical and the layer becomes quartz-like. The thickness of the $SiO_x$ layer can be controlled by the duration of the treatment and the concentration of the siloxanes. The treatment is continued only until such time as the frame structure of the encapsulation by the formation of the SiOx surface layer reaches the desired hermeticity in the sense of diffusion-tightness.

In a further preferred embodiment, the frame structure undergoes a UV-light/ozone ($O_3$) treatment after the singulation of the components. Surfaces can be cleaned and/or modified by means of a shortwave UV-light treatment. If UV-radiation with a wavelength below 200 nm strikes oxygen, ozone is formed. The ozone is itself decomposed by UV-light thereby forming highly reactive, free oxygen radicals.

In particular, adhesives on a silicone base are used to produce the frame structure, such as for example PDMS adhesives or POSS-containing adhesives, which after hardening comprise on their surface or in layers close to the surface Si—O and/or Si—OH units, which can be converted to form an $SiO_x$ surface layer by photochemical processes during the UV/ozone treatment. These photochemical processes preferably take place at room temperature.

The process parameters are optimised in such a way that a thin $SiO_x$ surface layer can arise. In a further embodiment, an additional component can also be introduced in this process similar to the plasma treatment.

In a further preferred embodiment, the frame structure is treated with a radiation source, in particular a laser, after the singulation of the components. According to the invention, the frame structure is produced from an adhesive, preferably a polymer adhesive.

In the case of laser irradiation of a polymer matrix, both thermal and athermal interaction processes take place, which can lead to a photochemical decomposition of the irradiated structure. These are complex photochemical and also photothermal reactions, wherein the proportions of the photochemical and photothermal reactions can be varied and are therefore controlled by the selection of 1) polymer material, 2) laser wavelength, 3) pulse times, etc. Athermal processes are understood to mean that the thermal effects, whilst still being present, can be neglected.

With the irradiation of the frame structure by laser, polymer fragments, decomposition products and gaseous products for example can arise, without the development of high temperatures. Athermal interaction processes are preferred, in order to prevent strain or damage to the components and the encapsulation.

With a low fluence (radiation energy per unit area with constant pulse duration) below the ablation limit, changes in the chemical composition of the polymer surface can be achieved. The intensity with which a polymer can be irradiated without ablation is dependent on the material and is determined experimentally.

According to a preferred embodiment of the present invention, the encapsulated and singulated components, in particular the frame structures, are exposed to a predetermined wavelength and/or power and/or pulse duration, wherein the predefined process parameters are preferably adapted to the given material. This embodiment is advantageous, since the penetration depth and the processes can be influenced by the wavelength and/or the pulse times and/or the laser power.

According to the invention, the material of the frame structure or adhesive material and the post-treatment process are matched to one another in such a way that the desired material conversion to form dense $SiO_x$ takes place in an optimised manner.

An essential advantage of the invention includes that the hermeticity and therefore the quality and useful life of the encapsulated components produced with adhesive as a bonding layer in the W2 W process are increased.

Substrates

A substrate or semiconductor substrate is understood to mean a not yet singulated, in particular round, semi-finished product of the semiconductor industry. In particular, the embodiment according to the invention related to wafers. The product substrate and the cover substrate are preferably radially symmetrical. Although the substrate can have any diameter, the substrate diameter is in particular 1 inch, 2 inches, 3 inches, 4 inches, 5 inches, 6 inches, 8 inches, 12 inches, 18 inches or greater than 18 inches. In special embodiments, a substrate can also have a rectangular shape, or at least one that diverges from the circular shape. A substrate is understood in the subsequent text to mean in particular a wafer.

The substrates preferably have approximately identical diameters D1 and D2, which diverge from one another in particular by less than 5 mm, preferably less than 3 mm, still more preferably less than 1 mm.

Cover Substrates

According to the invention, a frame structure of adhesive is deposited around the components which are to be packaged. The frame is of the same height as or higher than the components and is closed by a diffusion-tight cover. Glass, silicon, or plastics are preferably suited as the material for the cover substrate. Further materials are for example sapphire-glass, semiconductors, compound semiconductors, oxides, ceramic or metal. The diffusion-tight substrate cover can be transparent or opaque, when the components have to be protected from light. LEDs are for example built up from several layers and usually sealed by a glass or plastic plate. The quality of the encapsulation essentially determines here the useful life, since oxygen, moisture or dust grains can lead to failure.

Further advantages, features and details of the invention emerge from the following description of preferred examples of embodiment and with the aid of the drawings.

BRIEF DESCRIPTION OF DRAWINGS

FIG. 2a: shows a product substrate after a first process step of a method according to the invention in a first embodiment, FIG. 2b: shows a side view of the product substrate from FIG. 2a, FIG. 2c: shows a side view of a product substrate after a first process step of a method according to the invention in a second embodiment.

DETAILED DESCRIPTION OF INVENTION

Figure 1A:
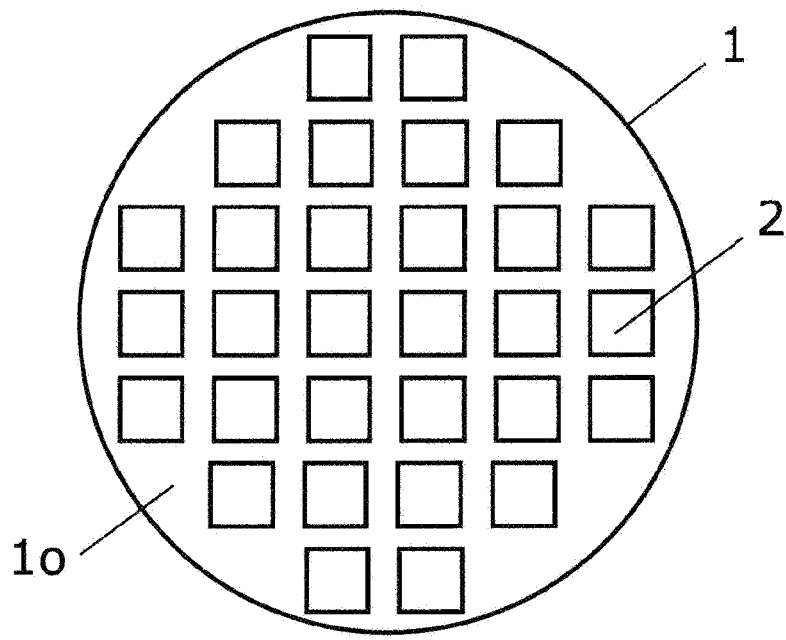
FIG. 1a: shows a plan view of a product substrate with components.
Figure 1B:
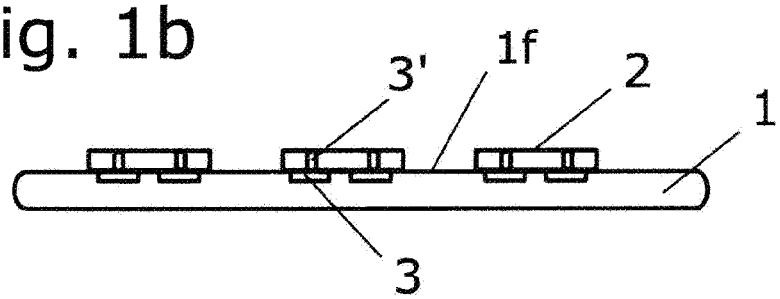
FIG. 1b: shows a cross-sectional view of a product substrate in a first embodiment.

A product substrate 1 is represented in FIG. 1a, on surface 1o whereof components 2 located thereon have been produced. According to FIG. 1b, these components 2 can also contain electrically conductive connections 3, 3'.

Figure 1C:
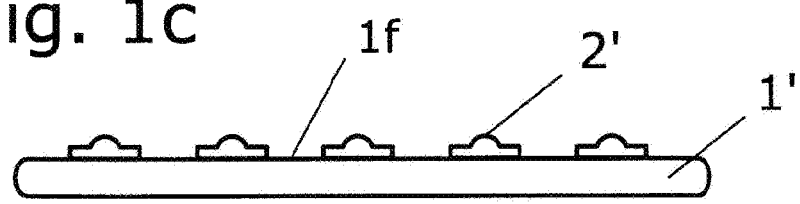
FIG. 1c: shows a cross-sectional view of a product substrate in a second embodiment.

In a further embodiment according to FIG. 1c, components 2' are optical structures, in particular microlenses, on and/or with a carrier substrate 1'. Processed substrates 1, 1' have precisely defined free areas if between components 2, 2', in order to be able to carry out the encapsulation process completely on the wafer level.

In a first step of an exemplary method according to the invention according to FIG. 2a, a frame structure 4 is deposited between components 2.

The encapsulation process according to the invention is based on a two-part encapsulation, i.e. with a frame structure 4 surrounding components 2, 2' and a cover substrate 5 placed thereon according to FIGS. 2b and 2c.

Frame structure 4 is produced from the adhesive, which is used for the bonding to cover substrate 5.

In the side view according to FIG. 2b, it can be seen that a wide frame structure 4 has been deposited. There is a free space 1f between components 2 and frame structure 4. The singulation of the components after the encapsulation according to FIG. 2b takes place for example along intersection lines S.

In a further example of embodiment according to FIG. 2c, individual frame structures 4' are deposited in each case between components 2, so that the singulation of the components takes place after the encapsulation between two frame structures 4'. See in this regard intersection lines S'.

The height of frame structure 4 can be varied greatly depending on requirements or depending on component type 2, 2'. If a cavity above components 2, 2' is required or desired, the required height of frame structure 4 is optimised in each individual case.

The height of frame structure 4 is understood to mean the total height of frame 4, 4', 4", 4'" including any adhesive layers still required.

Frame structure 4, 4', 4", 4'" is produced from the adhesive material which is used for the bonding to cover substrate 5. Thus, in the preferred embodiment, only an adhesive material is used to produce the frame structure.

Figure 3A:
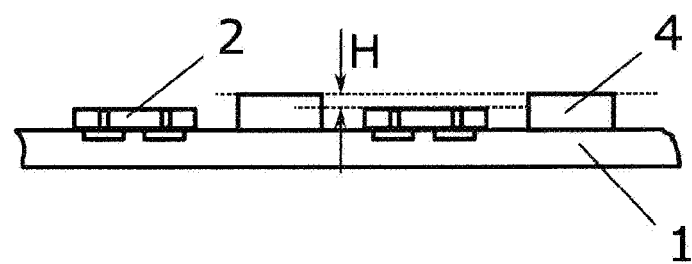
FIG. 3a: shows a side view of a frame structure of a product substrate in a first embodiment.
Figure 3B:
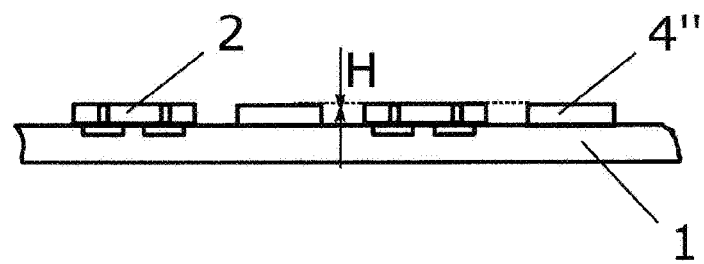
FIG. 3b: shows a side view of a frame structure of a product substrate in a second embodiment.

After the deposition of the frame structure, a height difference H arises between components 2, 2' and frame structure 4, 4" according to FIGS. 3a and 3b. In the embodiment according to FIG. 3b, height difference H is almost zero, since frame structure 4" and components 2 are almost the same height.

Figure 3C:
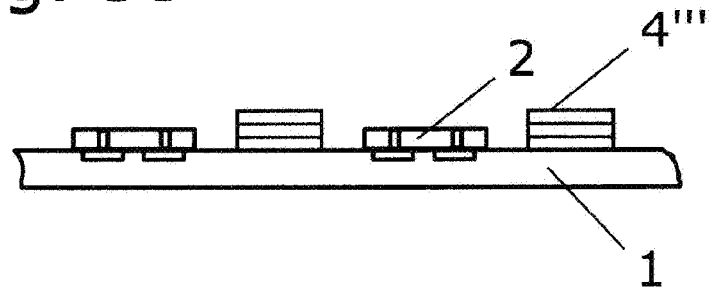
FIG. 3c: shows a side view of a frame structure of a product substrate in a third embodiment.

In another embodiment according to FIG. 3c, frame structure 4'" can be built up by the deposition of a plurality of layers of material. According to the invention, the adhesive as the material for frame structure 4'" can partially or completely cross-link after each deposited layer, i.e. hardening for example by UV radiation or supply of heat. In an alternative embodiment, depending on the viscosity and/or flow properties of the adhesive, a plurality of layers can first be deposited upon one another before complete hardening takes place.

According to the invention, the hardening is preferably based on a polymerisation of the adhesive. The polymerisation is started by a so-called initiator. If electromagnetic radiation is used for the hardening, at least one of the two substrates, in particular the cover substrate, is transparent or sufficiently transparent for electromagnetic radiation of the wavelength in which cross-linking of the adhesive occurs.

In a special embodiment, the complete hardening of the frame structure can also take place before the bonding of the product substrate and the cover substrate. In this embodiment, a layer of adhesive is applied congruent on the already hardened frame structure before the bonding of the product substrate and cover substrate and is hardened after the bonding.

The hardening process takes place by electromagnetic radiation, preferably by UV-light and/or under the effect of thermal radiation. The electromagnetic radiation has a wavelength in the range between 10 nm and 2000 nm, preferably between 10 nm and 1500 nm, more preferably between 10 nm and 1000 nm, most preferably between 10 nm and 500 nm.

A heat treatment takes place at less than 750° C., preferably at less than 500° C., still more preferably at less than 250° C., most preferably at less than 100° C., with utmost preference at less than 50° C. A heat treatment preferably takes place via thermal conduction through the sample holder. Heating of the surrounding atmosphere or a combination thereof is however also conceivable.

In a second process step, the bonding of the product substrate and the cover substrate takes place by gluing the frame structure to the diffusion-tight cover substrate according to FIGS. 2b and 2c, wherein the adhesive forms the frame structure. Pressure and/or temperature can also be used in the bonding of the product substrate with the adhesive. In the case of a transparent cover substrate, the hardening of the frame structure/the adhesive can take place after the bonding of the product substrate and the cover substrate.

Figure 4A:
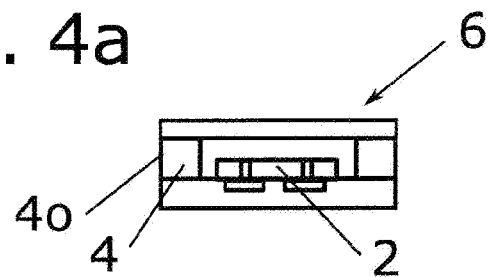
FIG. 4a: shows a side view of an encapsulated and singulated component in a first embodiment.

The singulation of the encapsulated components takes place in a further process step. FIG. 4a shows a singulated and encapsulated component 6. Unit 2 is framed at the sides by frame structure 4. The finished and encapsulated components located on the ready-processed substrate are separated during the singulation. The singulation of the components can take place by dicing, laser processes (laser dicing) or plasma processes (plasma dicing).

The outer surface of frame structure 4o does not enable encapsulation of high quality and hermeticity. In order to enable long-term stability of the components, the singulated and encapsulated components are subsequently treated in a last process step. In particular, a chemical conversion of outer surface 4o of frame structure 4 is achieved. As a result of the inventive subsequent chemical and/or physical treatment of the surface of frame structure 4o of the already singulated and encapsulated components, a simplified method for the encapsulation at the wafer level is used, which enables encapsulation of high quality and hermeticity.

The treated frame structure thus serves not only as a mechanical stabiliser, but also as protection against particles and media occurring in the atmosphere and/or in the surroundings, in particular fluids, more specifically liquids or gases, in particular water (humidity) and oxygen.

Figure 4B:
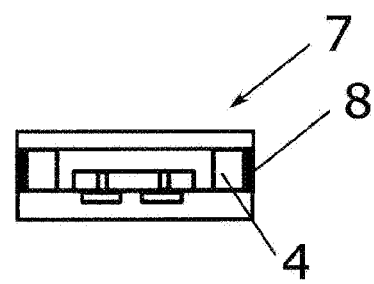
FIG. 4b: shows a side view of an encapsulated and singulated component in a first embodiment after a process step of a post-treatment of the surfaces for the surface conversion to form dense $SiO_x$.
Figure 4C:
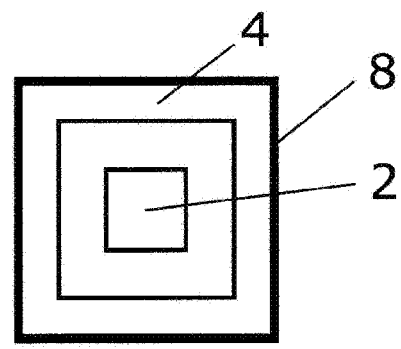
FIG. 4c: shows a plan view of an encapsulated and singulated component according to the invention after the last process step of the post-treatment of the surfaces for the surface conversion to form dense $SiO_x$.

FIGS. 4b and 4c show respectively in a side view and in a plan view outer frame structure 8 changed by the post-treatment of the encapsulated components according to the invention. According to the invention, adhesives on a silicone base are particularly preferred for producing the frame structure, such as for example PTMS adhesives or POSS-containing adhesives, which after hardening comprise on their surfaces or in layers close to the surfaces Si—O and/or Si—OH units, which can be converted by chemical and/or physical processes during the post-treatment to form an $SiO_x$ surface layer or an $SiO_2$ layer.

According to the invention, the outer layer of the frame structure becomes quartz-like. The thickness of the $SiO_x$ layer can be controlled by the duration of the treatment. The treatment is continued only until such time as the frame structure of the encapsulation by the formation of the SiOx surface layer reaches the desired hermeticity in the sense of diffusion-tightness. The formation of the SiOx surface layer or $SiO_2$ layer on the outer frame structure enables hermetic encapsulation despite different materials of the frame structure and of the substrates.

In a last process step, the post-treatment of the encapsulated components takes place.

Figure 5A:
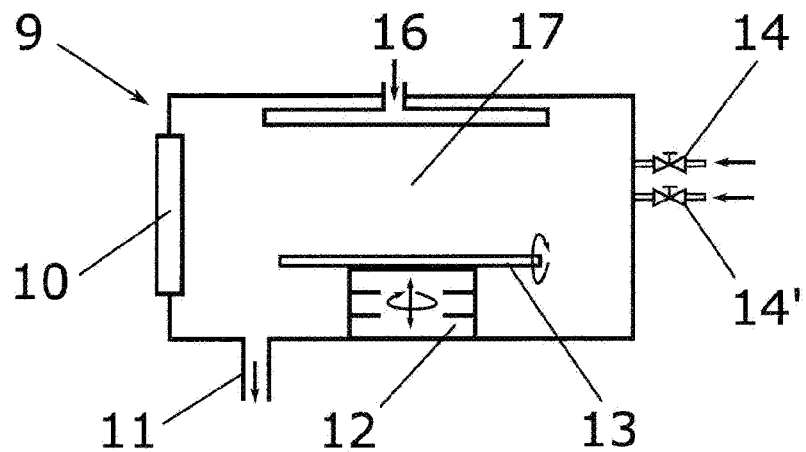
FIG. 5a: shows a diagrammatic representation of a first embodiment of the device according to the invention for the post-treatment of the encapsulated components.

FIG. 5a shows a process chamber for performing the post-treatment of the encapsulated components according to a first embodiment. Following the singulation, the encapsulated components do not necessarily have to be exposed.

If the singulated and encapsulated components are still fixed on a tape, in particular on a dicing tape clamped in a dicing frame, all the singulated components of a substrate or wafer can be treated simultaneously on the wafer level, without more time-consuming individual chip handling being required. Devices already existing for the handling of wafers can advantageously be used, as a result of which the post-treatment processes in a process chamber 9, 9' are simplified.

In a first embodiment, it is necessary for the further treatment of the encapsulated components to increase the spacing of the separated components by expanding the dicing tape. Expansion frames, for example, are used for this purpose. This permits improved access to the side walls, i.e. to the frame structure of the encapsulated components, and thus enables a more efficient post-treatment.

In process conditions in which tapes are no longer suitable, e.g. high temperatures and/or chemical and/or physical etching rates, the encapsulated components are processed in individual chip handling processes in a second embodiment. Devices and methods for placing a layer of singulated and encapsulated components in defined positions on a substrate are known in the prior art.

Thus, according to the invention, a plurality of singulated and encapsulated components can also be treated simultaneously in this embodiment.

In a third embodiment, the singulated and encapsulated components can also be transported and handled loose in a suitable receiving device.

Figure 5B:
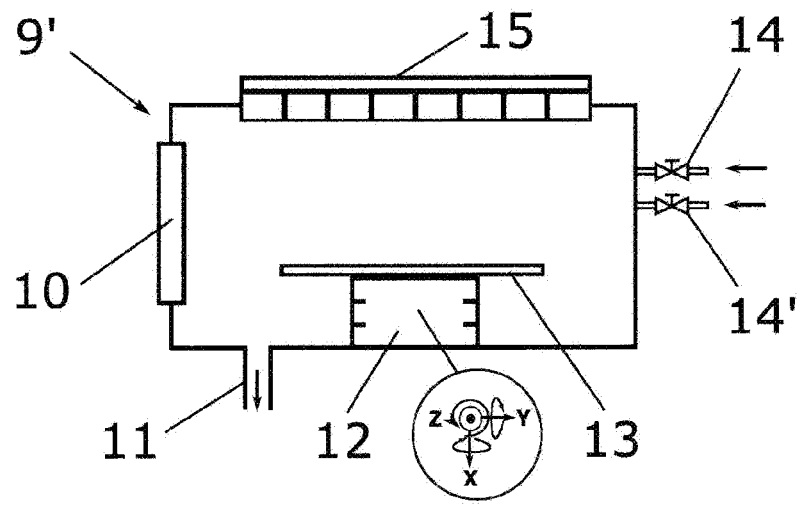
FIG. 5b: shows a diagrammatic representation of a second embodiment of the device according to the invention for the post-treatment of the encapsulated components, Identical components or components with the same function are denoted by the same reference numbers in the figures. The figures are not represented true to scale so as to improve the representation.

According to FIGS. 5a and 5b, the loading of process chamber 9, 9' with the diced encapsulated component structures located for example on an expanded dicing tape takes place via a loading device, preferably an airlock 10. A receiving device 13 serves to fix the dicing frame or the substrate in process chamber 9, 9'. Table 12 is designed in particular such that, during the loading with the dicing frame or substrate, the latter can be moved upwards and a robot arm can deposit the substrate. More generally, table 12 is moved in a z-direction according to requirements.

Furthermore, a rotation and/or tilting of receiving device 13 is possible. A spatially fixed coordinate system for the table movements is represented by way of example in FIG. 5b.

Process chamber 9, 9' can preferably be evacuated and heated. The heating can take place by heated receiving device(s) 13 and/or by radiant heating with suitable heat sources (not represented). Process chamber 9, 9' is provided with a suction and/or vacuum system 11. The receiving device according to FIGS. 5a and 5b is suitable for dicing frames or substrates. Alternatively, a basket as a receiving device is also possible.

Receiving device 13 and/or process chamber 9, 9' can be heated and temperature-controlled in a temperature range between 0° C. and 1000° C., preferably between 0° C. and 500° C., more preferably between 0° C. and 400° C., most preferably between 0° C. and 350° C. Receiving device 13 can in particular comprise holes. These holes can be smaller than the encapsulated components.

Receiving device 13 can also comprise sensors (not represented), with the aid of which physical and/or chemical properties can be measured. These sensors can for example be temperature sensors.

The embodiment according to FIG. 5a shows a process chamber 9, preferably a plasma chamber. There are various methods for producing plasmas, which differ markedly with regard to the type of energy coupling. A DC discharge can be produced by the application of a direct voltage. Capacitively coupled MHz discharges (CCP capacitively coupled plasma) are used for plasma etching and plasma coating. Ion flows and plasma density can be controlled separate from one another by using a plurality of frequencies. In the case of an inductively coupled discharge (ICP inductively coupled plasma), the plasma density is increased still further, since the plasma acts as a secondary winding of a transformer.

The plasmas produced by means of oxygen, nitrogen, noble gases or more complex organic gaseous compounds can modify the substrate surface both by ion bombardment and also by surface reactions by means of ions and/or radicals present in the plasma. Plasma processes are preferably used which enable chemical interactions with the frame material.

FIG. 5a shows a first embodiment of a plasma chamber 9 with a supply of reactive particles from a downstream plasma reactor 16. Such reactors are used to completely switch off the physical share of plasma etching. A plasma, preferably an oxygen plasma 17, predominates in the interior of process chamber 9. According to the invention, individual gases as well as mixtures thereof can be used to produce plasmas. In a preferred embodiment, oxygen plasma ($O_2$-plasma) is used.

A second embodiment of a plasma chamber contains for example a parallel plate reactor with symmetrical electrodes (not represented in the figures). In this embodiment, chemical and physical interactions take place with (amongst other things) the frame material. Irrespective of the structure of the plasma chamber, the process parameters of the $O_2$-plasma treatment are optimised in such a way that a surface conversion of the exposed frame structure, which is made of adhesive on a silicone base, takes place to form dense $SiO_2$. For this purpose, process parameters such as a gas mixture, temperature and duration of the $O_2$-plasma treatment are optimised in such a way that a successful and durable surface conversion to form dense $SiO_2$ takes place. Hermetic sealing of the already hardened outer frame structure of the encapsulated components is thus achieved. Tilting of receiving device 13 enables, where required, an optimised plasma access to the lateral frame structures of the singulated and encapsulated components.

In a third embodiment of a plasma post-treatment according to the invention, an additional component is introduced in the $O_2$-plasma process, in order to achieve a more rapid surface conversion of the exposed frame structure to form dense $SiO_2$ or $SiO_x$ by reaction with the surface of the frame structure. The additional component can be a mixture of a plurality of substances or an individual chemical compound. The additional component is preferably introduced as gas.

In process chamber 9, 9' according to FIGS. 5a and 5b, further preferably gaseous components can be introduced by means of valves 14, 14'.

In an embodiment according to the invention, siloxanes are used as a chemical compound. This includes for example disiloxane, hexamethyldisiloxane (HMDS) and octamethyltrisiloxane.

FIG. 5b shows a further embodiment of a process chamber 9' for the post-treatment of the singulated and encapsulated components. In process chamber 9' according to FIG. 5b, the outer surfaces of the frame structures undergo, after singulation, a UV-light/ozone ($O_3$) treatment. A receiving device 13 serves to fix the dicing frame or the substrate in process chamber 9'. Table 12 is designed in particular such that, when the dicing frame or substrate are loaded, the latter can be moved upwards and a robot arm can deposit the substrate. More generally, table 12 is moved in a z-direction according to requirements. Furthermore, a rotation or tilting of receiving device 13 is possible. A spatially fixed coordinate system for the table movements is represented in FIG. 5b.

Oxygen is introduced into the process chamber by means of one of valves 14, 14'. Radiation sources 15 enable the irradiation of the encapsulated components with UV-light. If UV-radiation with a wavelength below 200 nm strikes oxygen, ozone is formed. The ozone is itself decomposed by UV-light thereby forming highly reactive, free oxygen radicals.

According to the invention, adhesives on a silicone base are in particular used to produce the frame structure, such as for example PDMS adhesives or POSS-containing adhesives, which after hardening comprise on their surface or in layers close to the surface Si—O and/or Si—OH units, which can be converted to form an $SiO_x$ surface layer by photochemical processes during the UV/ozone treatment. These photochemical processes preferably take place at room temperature.

Process parameters are optimised in such a way that a thin $SiO_x$ surface layer can arise. In a further embodiment, an additional gaseous component can also be introduced via valves 14, 14' in this process similar to the plasma treatment. Similar to the process chamber from FIG. 5a, a suction system and/or a vacuum system 11 as well as an airlock 10 are also present here.

In alternative embodiments of process chamber 9', radiation source(s) 15 can also be IR-light and/or laser. Radiation source 15 can, as required, comprise a plurality of (parallel) light sources as well as just one single radiation source. This radiation source can be designed to be mobile. In a further embodiment, the frame structure is treated in particular with a laser after singulation of the components.

According to the invention, use is preferably made at least predominantly, preferably exclusively, of coherent photon sources, in particular microwave sources, preferably masers, or lasers constituted as coherent photon sources for visible, IR, UV and x-ray light. With a low fluence (radiation energy per unit area with constant pulse duration) below the ablation limit, changes in the chemical composition of the frame material surface can thus be achieved.

The encapsulated and singulated components, in particular the frame structures, are exposed to a predefined wavelength and/or power and/or pulse duration, wherein the predefined process parameters are preferably matched to the given material. This embodiment is advantageous, since the penetration depth and the processes can be influenced by the wavelength and/or the pulse times and/or the laser power. The photon sources can be operated in a continuous operation or preferably in a pulsed operation. The pulse times are in particular less than 1 s, preferably less than 1 ms, still more preferably less than 1 μs, most preferably less than 1 ns. The times between successive pulses are preferably greater than 1 ms, more preferably greater than 10 ms, most preferably greater than 1 s. Tilting of receiving device 13 also enables, where required, an optimised radiation access to the (lateral) frame structures of the singulated and encapsulated components.

In a special embodiment, process chamber 9, 9' according to the invention is arranged as a module in a cluster system. The module, in which the process chamber according to the invention is located for the post-treatment of the encapsulated components, can, depending on requirements, be evacuated preferably independently of the (vacuum) cluster system, to a pressure of less than 1 bar, preferably less than $10^{-3}$ mbar, more preferably less than $10^{-5}$ mbar, most preferably less than $10^{-8}$ mbar.

After unloading the processed encapsulated components from the process chamber, the latter can be removed individually from the dicing tape.

In particular, the material of the frame structure or adhesive material and the post-treatment process are matched to one another in such a way that the desired material conversion to form dense $SiO_x$ takes place in an optimised manner. An advantage of the invention includes increasing by the post-treatment the hermeticity, and therefore the quality and useful life of the encapsulated components produced with adhesive as a bonding layer in the W2W process.

LIST OF REFERENCE NUMBERS

1 Product substrate/carrier substrate
1o Substrate surface
1f, 1f′ Exposed surface
2, 2′ Components
3, 3′ Contacts and/or electrically conductive connections
4, 4′, 4″, Frame structure 4‴
4o Outer surface of the frame structure on the encapsulated and singulated component structures
5 Cover substrate
S, S′ Intersection line
H Height difference between structure of frame structure and component structure
6 Encapsulated and singulated component
7 Encapsulated and singulated component after the post-treatment of the (frame structure) surfaces
8 $SiO_x$ surface layer
9, 9′ Process chamber
10 Airlock
11 Suction and/or vacuum system
12 Table
13 Receiving device for singulated and encapsulated components (dicing frame, substrate, basket, etc.)
14, 14′ Gas valve
15 Radiation source(s) (IR-light and/or UV-light and/or laser etc.)
16 Supply of reactive particles from a downstream plasma reactor
17 ($O_2$)-plasma

What is claimed is:

1. A method for producing singulated encapsulated components, said method comprising:
application of a frame structure on a substrate surface of a substrate, wherein the frame structure surrounds components arranged on the substrate surface;
bonding of a cover substrate on the frame structure;
hardening of the frame structure; and
singulation of the encapsulated components,
wherein the frame structure is formed from an adhesive,
wherein the singulated encapsulated components are treated with plasma and/or reactive gas, wherein the plasma and/or gas treatment is conducted after the hardening of the frame structure, and wherein the plasma and/or gas treatment leads to a chemical conversion of an outer surface of the frame structure.

2. The method according to claim 1, wherein the adhesive is a silicone adhesive.

3. The method according to claim 1, wherein the singulated encapsulated components are treated in such a way that on the outer surface of the frame structure a glass-like structure arises.

4. The method according to claim 3, wherein the glass-like structure is an $SiO_2$ structure.

5. The method according to claim 1, wherein the hardening of the frame structure takes place before the bonding of the cover substrate on the frame structure.

6. The method according to claim 1, wherein the adhesive of the frame structure is applied by inkjet processes, printing processes, casting, coating, spraying, extruding, spray coating, spray lacquering and/or lacquering.

7. A singulated encapsulated component, produced with a method according to claim 1.

* * * * *